(12) United States Patent
Rodig (10) Patent No.: US 8,870,149 B2
(45) Date of Patent: Oct. 28, 2014

(54) HOLD-DOWN ASSEMBLY

(75) Inventor: Nicholas P. Rodig, Pewaukee, WI (US)

(73) Assignee: Carlisle Interconnect Technologies, Inc., Saint Augustine, FL (US)

( * ) Notice: Subject to any disclaimer, the term of this patent is extended or adjusted under 35 U.S.C. 154(b) by 789 days.

(21) Appl. No.: 12/748,607

(22) Filed: Mar. 29, 2010

(65) Prior Publication Data

US 2011/0233372 A1    Sep. 29, 2011

(51) Int. Cl.
*A47B 97/00* (2006.01)
*H05K 7/14* (2006.01)

(52) U.S. Cl.
CPC ................................. *H05K 7/1412* (2013.01)
USPC ........ 248/503; 403/325; 403/322.2; 248/507; 411/298

(58) Field of Classification Search
CPC ... H05K 7/1412; B25B 23/141; F16D 43/206
USPC ............... 248/503, 507; 403/325, 322.2, 328; 410/77; 24/573.11, DIG. 56; 464/36, 37
See application file for complete search history.

(56) References Cited

U.S. PATENT DOCUMENTS

| | | | | |
|---|---|---|---|---|
| 2,344,673 A | * | 3/1944 | Brown | 464/37 |
| 2,984,133 A | * | 5/1961 | Zimmerman | 81/474 |
| 3,212,746 A | * | 10/1965 | Wright | 410/77 |
| 3,255,796 A | * | 6/1966 | Tobey | 411/298 |
| 3,282,316 A | * | 11/1966 | Griswold | 411/326 |
| 3,640,141 A | * | 2/1972 | Hollingsead et al. | 74/89.38 |
| 3,720,077 A | * | 3/1973 | Jackson et al. | 464/37 |
| 3,734,444 A | * | 5/1973 | Thorngate | 248/503 |
| 3,796,985 A | * | 3/1974 | Weber | 439/359 |
| 3,877,672 A | * | 4/1975 | Wright | 248/503 |
| 4,263,996 A | * | 4/1981 | Putney | 192/56.57 |
| RE32,546 E | * | 11/1987 | Roake | 74/89.38 |
| 4,718,632 A | * | 1/1988 | Meineke | 248/681 |
| 4,830,530 A | * | 5/1989 | Meineke | 403/12 |
| 4,901,836 A | * | 2/1990 | Stenmark et al. | 192/56.5 |
| 5,013,197 A | | 5/1991 | Allaert et al. | |
| 5,433,550 A | * | 7/1995 | Huber | 403/348 |
| 5,437,524 A | * | 8/1995 | Huang | 408/139 |
| 5,452,979 A | * | 9/1995 | Cosenza | 411/348 |
| 5,576,501 A | * | 11/1996 | Huang | 73/862.23 |
| 5,846,042 A | * | 12/1998 | Iannuzzi | 411/120 |

(Continued)

OTHER PUBLICATIONS

Ten-Page International Search Report mailed Jun. 9, 2011 (received Jun. 30, 2011) for corresponding PCT Application Serial No. PCT/US2011/029495.

*Primary Examiner* — Terrell McKinnon
*Assistant Examiner* — Daniel Breslin
(74) *Attorney, Agent, or Firm* — Wood, Herron & Evans, LLP (57) ABSTRACT

A hold-down assembly for retaining a portable electronic unit within an avionics equipment mounting tray includes a shaft, a locking collar, and an actuator knob. The shaft is coupled to pivot with the mounting tray. The locking collar slides along the shaft to engage the portable electronic unit. The actuator knob includes a knob body, a ratchet plate having detent holes within the knob body, a ball bearing, and a compression spring within the knob body. As the actuator knob is rotated to move along the shaft, the knob body and the ball bearing rotate with respect to the ratchet plate, and the ball bearing is forced against a spring bias of the compression spring as the ball bearing travels between adjacent detent holes.

13 Claims, 5 Drawing Sheets

(56) References Cited

U.S. PATENT DOCUMENTS

| | | | | |
|---|---|---|---|---|
| 5,855,517 A | * | 1/1999 | Lepold | 464/36 |
| 6,045,303 A | * | 4/2000 | Chung | 408/124 |
| 6,132,435 A | * | 10/2000 | Young | 606/104 |
| 6,152,645 A | * | 11/2000 | Sanford | 403/328 |
| 6,158,916 A | * | 12/2000 | Wormsbaecher | 403/310 |
| 6,832,533 B1 | * | 12/2004 | Huang | 81/475 |

* cited by examiner

HOLD-DOWN ASSEMBLY

TECHNICAL FIELD

This invention relates to avionics equipment, and more specifically to assemblies for securing portable electronic units to avionics equipment mounting trays.

BACKGROUND

In an aircraft, a plurality of electronic units are often mounted or stored in an avionics bay or rack. While some electronic units are permanently mounted within the avionics bay, other electronic units may be portable such that the units can be removed from the bay and transported to and from the aircraft, such as the well-known aircraft "black box." These portable or plug-in electronic units must be operatively connected to a supply of power and plugged into the central control system of the aircraft in operation. Consequently, a plurality of avionics equipment mounting trays is provided in the avionics bay of an aircraft. The avionics equipment mounting trays include a support structure for holding the portable electronic unit and a mating wire harness or plug for plugging a portable electronic unit into a system and enabling communication between the portable electronic unit and the central control system. The portable electronic unit must have a reliable connection with the mating wire harness or plug to ensure proper operation of the avionics equipment in the portable electronic unit. As may be appreciated, an active avionics environment provides various vibration, shaking, and other similar forces on the units plugged into an avionics bay. Therefore, the connection of a unit into operation with the central system must be robust.

To provide a robust and reliable connection between the portable electronic unit and the mating wire harness, a hold-down assembly may be provided on the avionics equipment mounting tray. The hold-down assembly includes a locking collar that engages with a portion of a housing of the portable electronic unit. The locking collar applies a force to the portable electronic unit to ensure engagement of the portable electronic unit with the mating wire harness.

When an aircraft operates, a high amount of vibration is imposed on the portable electronic units and the avionics equipment mounting trays. This vibration can force conventional hold-down assemblies to loosen from engagement with the portable electronic unit. The portable electronic unit can then become disengaged with the mating wire harness, thereby affecting the proper operation of the avionics equipment. Thus, it would be desirable to provide a hold-down assembly that resists typical vibration forces from aircraft operation while applying an appropriate force to hold the portable electronic unit in position on the avionics equipment mounting tray.

SUMMARY

The invention according to one embodiment includes a hold-down assembly for retaining a portable electronic unit within an avionics equipment mounting tray. The hold-down assembly includes a hinge block, a shaft, a locking collar, and an actuator knob. The hinge block is coupled to the avionics equipment mounting tray. The shaft includes external threads and is coupled to pivot with the hinge block. The locking collar engages the portable electronic unit and includes a central bore which may slide along the shaft. The actuator knob is threadably engaged with the shaft. The actuator knob includes a knob body, a ratchet plate within the knob body, a ball bearing, and a compression spring within the knob body. The compression spring biases the ball bearing into engagement with the ratchet plate, which includes a number of detent holes that the ball bearing may seat in. As the actuator knob is rotated to move along the shaft, the knob body and the ball bearing rotate with respect to the ratchet plate, and the ball bearing is forced against the spring bias of the compression spring as the ball bearing travels between adjacent detent holes.

In another embodiment, a method of retaining a portable electronic unit within an avionics equipment mounting tray is disclosed. The avionics equipment mounting tray includes a hold-down assembly with a shaft, a locking collar, and an actuator knob. The shaft is coupled to pivot with the avionics equipment mounting tray and the locking collar slides along the shaft. The actuator knob is threadably engaged with the shaft and includes a knob body, a ratchet plate within the knob body, and a spring-biased ball bearing within the knob body. The method includes sliding the locking collar along the shaft and over a hook on the portable electronic unit. The method also includes rotating the actuator knob to move the knob body into direct engagement with the locking collar, thereby applying a locking force on the portable electronic unit. The method further includes biasing the ball bearing into engagement with a detent hole in the ratchet plate, thereby preventing undesirable rotation of the actuator knob caused by vibration applied to the hold-down assembly.

BRIEF DESCRIPTION OF THE DRAWINGS

The accompanying drawings, which are incorporated in and constitute a part of this specification, illustrate an embodiment of the invention and, together with a general description of the invention given below, serve to explain the principles of the invention.

DETAILED DESCRIPTION

FIGS. 1-5 illustrate an exemplary embodiment of a hold-down assembly 10 for retaining a portable electronic unit 12 within an avionics equipment mounting tray 14. The hold-down assembly 10 includes a hinge block 16 coupled to the avionics equipment mounting tray 14, a shaft 18 coupled to pivot with the hinge block 16. A locking collar 20 and an actuator knob 22 move on the shaft 18. The locking collar 20 may be engaged with a portion of the housing of unit 12, such as an L-shaped hook 24 (also known as a J-hook) mounted with the portable electronic unit 12. The actuator knob 22 is rotated into direct engagement with the locking collar 20 to push the collar along the shaft 18. The actuator knob 22 then applies a locking force on the locking collar 20 and, therefore, on the portable electronic unit 12 (via hook 24) to hold the portable electronic unit 12 in position on or in the avionics equipment mounting tray 14. In the exemplary embodiment of FIG. 1, the portable electronic unit 12 is a unit, such as an aircraft "black box", having electrical power and data-transferring connectors or sockets and plugs (not shown) along a rear surface 26. A handle 28 is positioned on a front surface 30. The corresponding rear wall 32 of the avionics equipment mounting tray 14 may include a mating wire harness (not shown) configured to engage the connectors/sockets/plugs provided on the portable electronic unit 12 when the portable electronic unit 12 is locked into the position shown in FIG. 1. Consequently, the hold-down assembly 10 ensures that the portable electronic unit 12 stays in operative contact with the mating wire harness and the other electronic equipment in the aircraft or avionics bay.

Figure 1:
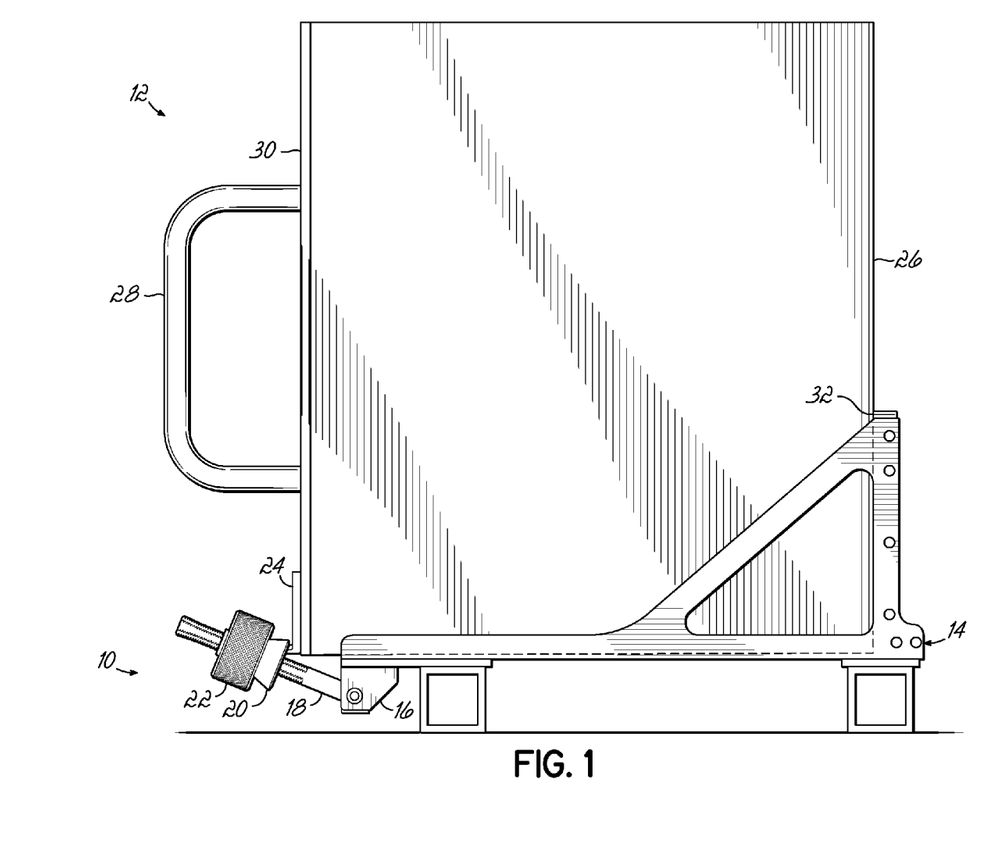
FIG. 1 is a side view of an avionics equipment mounting tray incorporating a hold-down assembly according to one embodiment of the invention.
Figure 2:
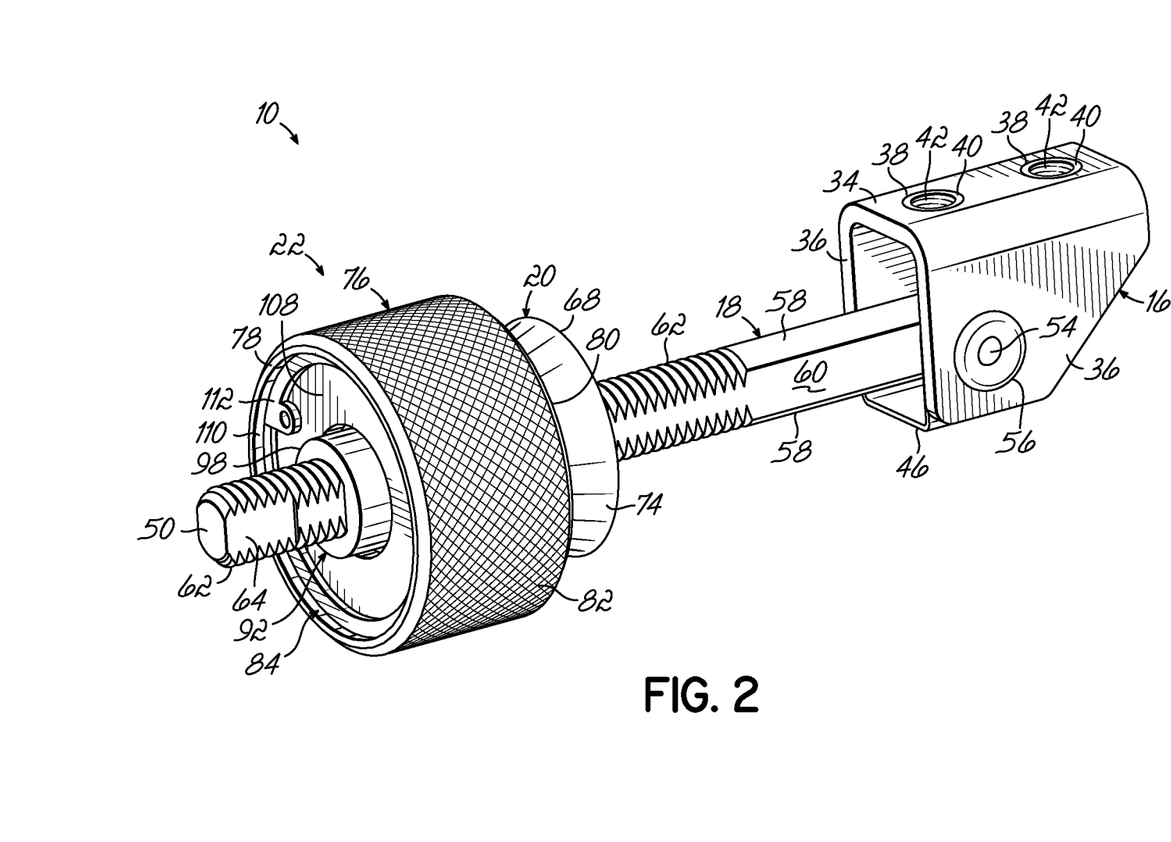
FIG. 2 is a perspective view of the hold-down assembly of FIG. 1.
Figure 3:
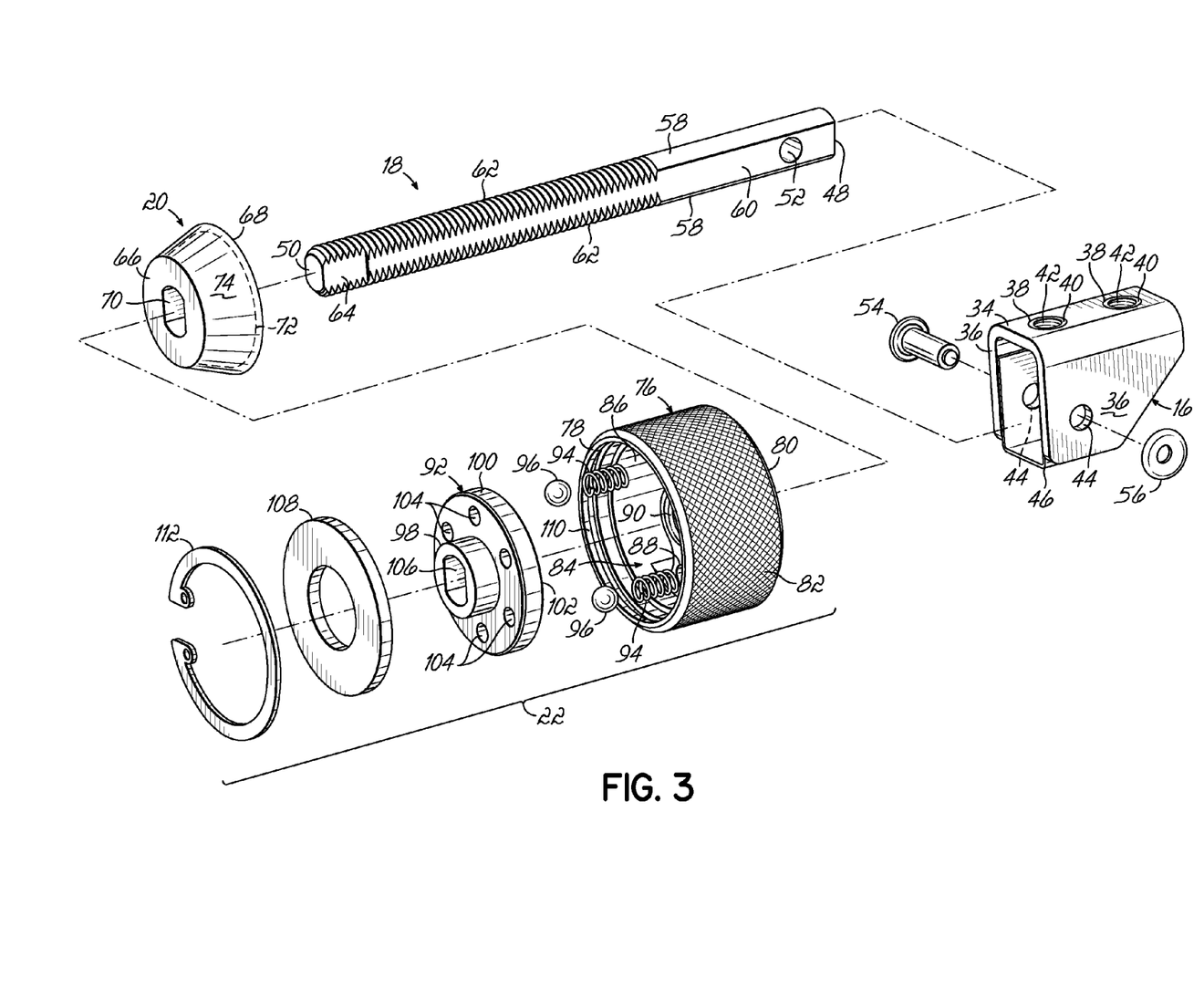
FIG. 3 is a perspective exploded view of the hold-down assembly of FIG. 1.
Figure 4:
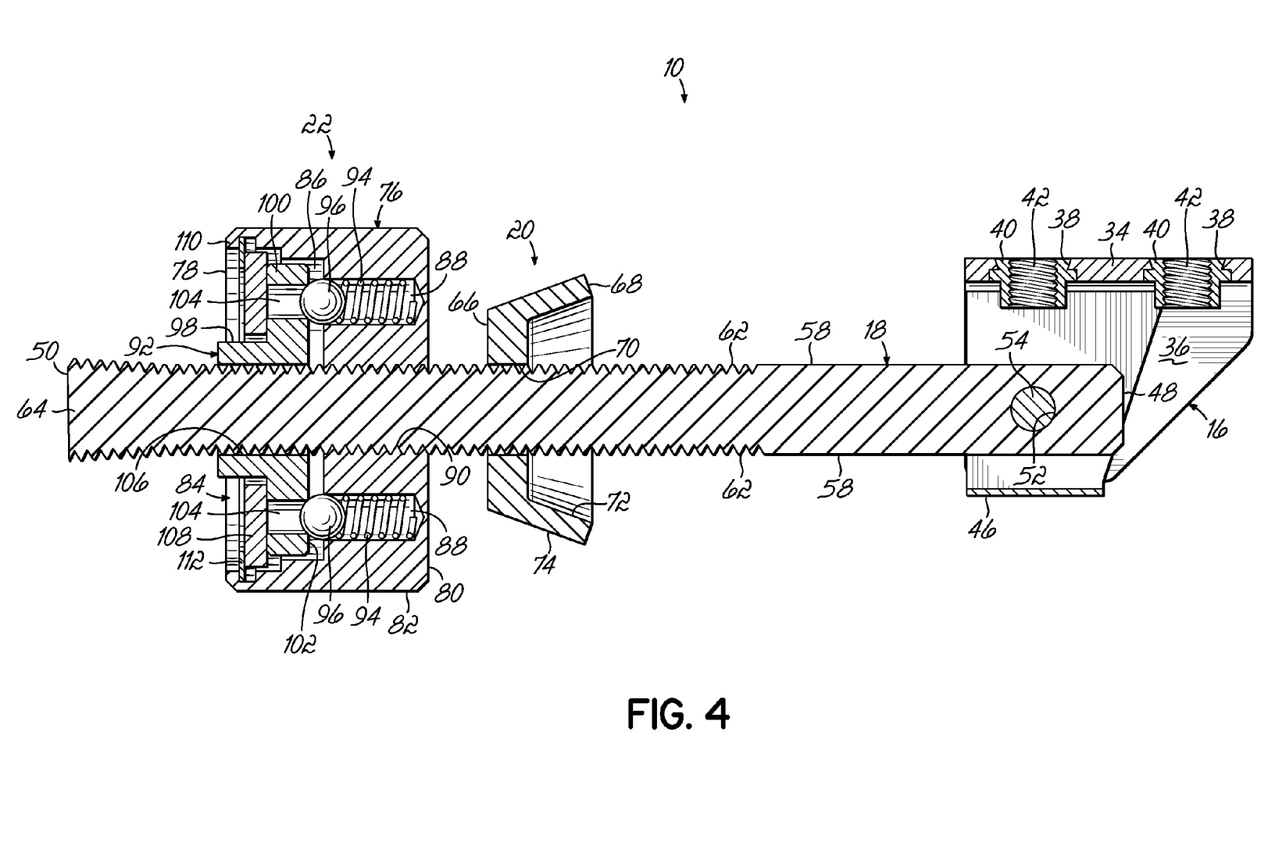
FIG. 4 is a cross-sectional side view of the hold-down assembly of FIG. 1.

Further details of the hold-down assembly 10 are illustrated in FIGS. 2-4. The hinge block 16 is a generally-U-shaped member having a top wall 34 and a pair of sidewalls 36 extending downwardly from the top wall 34. The top wall 34 may include a pair of countersunk apertures 38. A pair of steel press nuts 40 may be driven into engagement with the countersunk apertures 38 to form an interference fit. The steel press nuts 40 include internal threads 42 for engagement with the avionics equipment mounting tray 14 as described in further detail below. The pair of sidewalls 36 includes pivot apertures 44 as shown most clearly in FIG. 3. A hinge cap 46 may be engaged with the pair of sidewalls 36 opposite the top wall 34 to close the interior of the hinge block 16.

The shaft 18 includes a first end 48 adjacent to the hinge block 16 and a second end 50. The first end 48 includes a through aperture 52 that is aligned with the pivot apertures 44 in the hinge block 16. A pivot pin 54 is then inserted through the pivot apertures 44 in the sidewalls 36 and the through aperture 52 in the shaft 18 to pivotally couple the shaft 18 and the hinge block 16. The pivot pin 54 may be in the form of a tubular rivet that has an end rolled over to form a cap or head 56 after being assembled. Alternatively, a pivot pin cap may be a separate part, as shown in FIG. 3, and clipped or otherwise secured onto the pivot pin 54 to form the cap or head, and lock the pivot pin 54 in position. The shaft 18 may include a non-circular cross section such as a double-D cross section. The double-D cross section includes two opposing curved portions 58 and two opposing flattened portions 60 as shown in FIG. 2. The shaft 18 includes external threads 62 along the curved portions 58 of the double-D cross section. At the second end 50, the shaft 18 may be flattened to form a deformed portion 64 after the locking collar 20 and actuator knob 22 are placed on the shaft 18 as shown in FIG. 2. The deformed portion 64 has a cross-section larger than bore 106, and prevents the locking collar 20 and actuator knob 22 from being removed from the shaft 18 at the second end 50 (See FIG. 4).

The locking collar 20 has a generally frusto-conical shape including a narrow side 66 and a wide side 68, the wide side 68 faces the hinge block 16 when the locking collar 20 is inserted onto the shaft 18. The locking collar includes a central bore 70 extending from the narrow side 66. The bore 70 is sized to match the cross-section of the shaft 18. Thus, in the exemplary embodiment of FIGS. 2-4, the central bore 70 has a double-D shape in cross-section, which allows the locking collar 20 to freely slide along the shaft 18 but prevents rotation of the collar on the shaft 18. The locking collar 20 also includes a tapered countersunk hole 72 in communication with the central bore 70 and defining a peripheral collar portion 74 adjacent to the wide side 68. The peripheral collar portion 74 is adapted to slide onto the L-shaped hook 24 or other element of the portable electronic unit 12 so that the L-shaped hook 24 is disposed within the tapered countersunk hole 72 of the locking collar 20.

The actuator knob 22 includes a knob body 76 having a front side 78, a rear side 80, and a peripheral surface 82 extending between the front and rear sides 78, 80. The knob body 76 includes an interior bore 84 extending inwardly from the front side 78. The interior bore 84 includes a primary bore portion 86, at least one spring bore portion 88 extending further toward the rear side 80 from the primary bore portion 86, and a shaft bore 90 which extends all the way through the knob body 76 to the rear side 80 and includes internal threads for threadably engaging the external threads 62 of the shaft 18. Thus, the actuator knob 22 may be rotated to advance along the shaft 18. The peripheral surface 82 of the knob body 76 may be knurled to form a gripping surface for a user's hand to rotate the actuator knob 22.

The actuator knob 22 also includes a ratchet plate 92 disposed within the primary bore portion 86, a compression spring 94 disposed within each of the spring bore portion 88, and a ball bearing 96 between each compression spring 94 and the ratchet plate 92. The ratchet plate 92 includes a hub portion 98 and a wheel portion 100 defining an interior side 102 of the ratchet plate 92. The wheel portion 100 including a plurality of detent holes 104 drilled through the interior side 102 of the ratchet plate 92 in a circular pattern around a plate bore 106 extending through the ratchet plate 92. The plate bore 106 has a double-D shape in cross-section corresponding to the shaft 18, which allows the ratchet plate 92 to freely slide along the shaft 18 but prevents relative rotation of the ratchet plate 92 on the shaft 18. The detent holes 104 are arranged to engage the ball bearings 96 as shown in FIG. 4. It will be appreciated that the actuator knob 22 may include one compression spring 94 and ball bearing 96 or a plurality of compression springs 94 and ball bearings 96 in other embodiments.

The ratchet plate 92 is held within the interior bore 84 of the knob body 76 by a plate cap 108 received over the hub portion 98. After the compression springs 94, ball bearings 96, ratchet plate 92, and plate cap 108 are placed within the interior bore 84, the knob body 76 is pressed in a Haeger press to form an inwardly-directed rolled edge 110 of the knob body 76 at the front side 78. The plate cap 108 may directly engage the rolled edge 110 of the knob body 76 in some embodiments, or an additional locking ring 112 may be positioned between the plate cap 108 and the rolled edge 110 as shown in the exemplary embodiment. Thus, the ratchet plate 92 and knob body 76 move longitudinally in unison along the shaft 18 when the actuator knob 22 is rotated.

In operation, the actuator knob 22 is rotated to advance longitudinally along the shaft 18 by virtue of the threaded engagement of the shaft bore 90 and the external threads 62 of the shaft 18. When the actuator knob 22 rotates, the knob body 76, compression springs 94, and ball bearings 96 all rotate while the ratchet plate 92 does not rotate because of the double-D shaped cross-sectional engagement of the plate bore 106 and the shaft 18. Thus, the knob body 76 and ball bearings 96 rotate with respect to the ratchet plate 92. The ball bearings 96 are forced out of a detent hole 104 by the interior side 102 of the ratchet plate 92 against the bias of the respective compression spring 94, and then the ball bearings 96 snap back into the next detent hole 104 that comes into registration with the corresponding spring bore portion 88 due to the rotation. This snapping of the ball bearings 96 into the detent holes 104 causes an audible snap or click noise to be heard by a user as the actuator knob 22 is moved along the shaft 18.

The knob body 76, compression springs 94, and ball bearings 96 are typically formed from a metal material such as stainless steel. In another possible embodiment, the knob body 76 might be formed of a suitable plastic to reduce weight and cost. A threaded metal insert might then be used in the knob body to engage the shaft 18. The ratchet plate 92, plate cap 108, and locking ring 112 may all be formed of a thermoplastic material such as an acetal. As the actuator knob 22 moves along the shaft 18, the knob body 76 (at the rolled edge 110) and ball bearings 96 slide or roll as they rotate against the ratchet plate 92, plate cap 108, and locking ring 112. Thus, the engagement of steel material with acetal material minimizes the frictional forces resisting the relative rotation of the knob body 76 and ratchet plate 92, thereby increasing the life span of each element of the actuator knob 22. This steel-acetal engagement also minimizes the required input torque required from a user's hand to rotate the actuator knob 22 and move it along the shaft 18.

Figure 5:
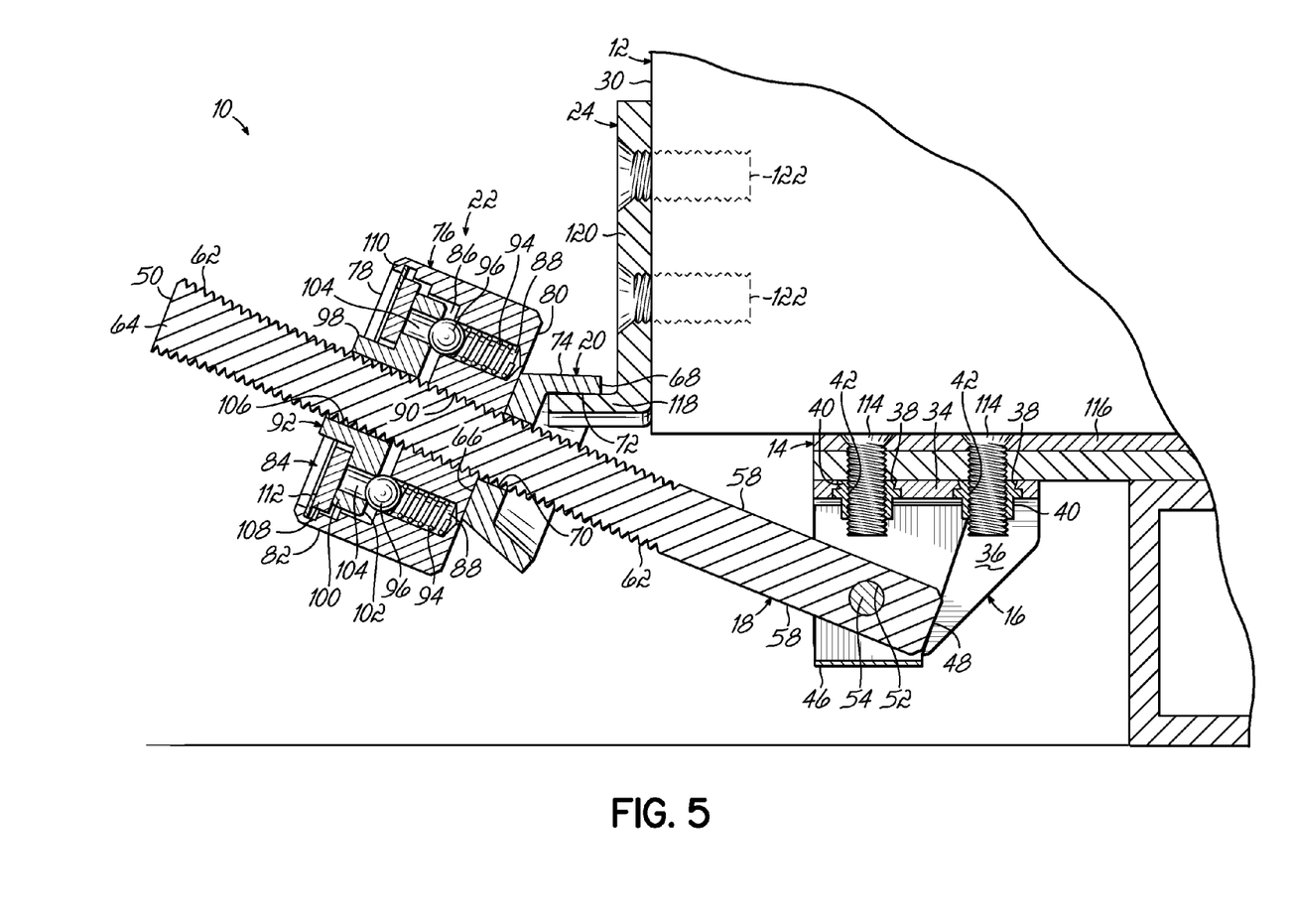
FIG. 5 is a cross-sectional side view of the avionics equipment mounting tray and hold-down assembly of FIG. 1.

The installation and operation of the hold-down assembly 10 in retaining the portable electronic unit 12 in the avionics equipment mounting tray 14 is further clearly illustrated in FIG. 5. The hinge block 16 is coupled to a bottom wall 116 of the avionics equipment mounting tray 14 by a pair of threaded connectors 114 that extend downwardly from the bottom wall 116 into threaded engagement with the internal threads 42 of the steel press nuts 40. The hold-down assembly 10 is thus connected to the avionics equipment mounting tray 14. As shown in FIG. 5, the L-shaped hook 24 includes a first leg 120 coupled to the front surface 30 of the portable electronic unit 12 using a pair of threaded bolts 122, and the L-shaped hook 24 also includes a second leg 118 extending generally outwardly from the portable electronic unit 12.

To lock the portable electronic unit 12 into position, the shaft 18 is pivoted upwardly and the locking collar 20 is slid along the shaft until the peripheral collar portion 74 surrounds the second leg 118 of the L-shaped hook 24. The second leg 118 is therefore inserted into the tapered countersunk hole 72 in the locking collar 20 as shown in FIG. 5. Then the actuator knob 22 is rotated to advance along the shaft 18 until the rear side 80 of the knob body 76 abuts the narrow (front) side 66 of the locking collar 20. Further rotation of the actuator knob 22 applies a locking force through the locking collar 20 and the L-shaped hook 24 to the portable electronic unit 12. The present invention provides a significant advantage in achieving a suitable locking force for locking the unit due to its construction. For example, applying 10 inch-pounds of manual torque force to the actuator knob 22 will lock the actuator knob 22 in a position that applies an approximate 125 pound linear force to the portable electronic unit 12. Using the manual torque force provided by an average human, the applied linear force may be as high as around 140 pounds, on average. Such a force is more than sufficient to ensure and maintain proper electrical connection between the portable electronic unit 12 and the mating wire harness. The actuator knob 22 will audibly snap as the hold-down assembly is placed into the locking position as previously described.

The hold-down assembly 10 not only provides a high amount of locking force for an applied manual application of torque, but also resists local vibration forces without using only shaft friction to overcome the vibration. In that way, the assembly maintains its achieved locking force without significant loosening. As shown in FIG. 5, the ball bearings 96 are forced into respective detent holes 104 in the ratchet plate 92 in the locking position of the hold-down assembly 10. The compression springs 94 are designed to require a minimal force to dislodge the ball bearings 96 from the detent holes 104, but this minimal force is significant enough to resist severe vibration loadings on the hold-down assembly 10. Consequently, the actuator knob 22 of the hold-down assembly reliably maintains a locking position on the shaft 18 despite the sometimes severe vibrations that may happen in the flight of an aircraft. As such, the portable electronic unit 12 stays in operative communication with the other avionics equipment in the aircraft throughout a flight.

While the present invention has been illustrated by the description of the embodiment thereof, and while the embodiment has been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A hold-down assembly for retaining a portable electronic unit within an avionics equipment mounting tray, the hold-down assembly comprising:
    a hinge block coupled to the avionics equipment mounting tray;
    a shaft pivotally coupled to the hinge block and including external threads;
    a locking collar configured to engage the portable electronic unit and including a central bore configured to slide along the shaft; and
    an actuator knob, separate from the locking collar, and threadably engaged with the shaft to be rotated about the shaft and moved along the shaft to drive the locking collar, the actuator knob including a threaded and rotatable knob body, a non-rotatable ratchet plate disposed within the rotatable knob body, a plurality of detents positioned around the non-rotatable ratchet plate, at least one ball bearing, and at least one compression spring disposed within the knob body and biasing the at least one ball bearing into engagement with one of a plurality of detents in the non-rotatable ratchet plate,
    the knob body being rotatable around the non-rotatable ratchet plate to move the actuator knob along the shaft, the knob body and the at least one ball bearing rotating in relation to the non-rotatable ratchet plate such that the at least one ball bearing is forced against the spring bias as the at least one ball bearing travels between adjacent detents and is forced by the spring bias into a detent in the non-rotatable ratchet plate to deter undesired rotation of the actuator knob.

2. The hold-down assembly of claim 1, wherein the portable electronic unit includes an L-shaped hook having a first leg coupled with the portable electronic device and a second leg extending outwardly from the portable electronic device, and the locking collar further includes a peripheral collar portion for engaging the second leg of the L-shaped hook.

3. The hold-down assembly of claim 2, wherein the peripheral collar portion of the locking collar defines a tapered countersunk hole in communication with the central bore, and the second leg of the L-shaped hook on the portable electronic unit extends into the tapered countersunk hole of the locking collar in a locking position.

4. The hold-down assembly of claim 1, wherein the shaft is at least partially non-circular in cross-section.

5. The hold-down assembly of claim 4, wherein the shaft includes a double-D-shaped cross-section having two flattened portions and two curved portions, the external threads being formed on the curved portions.

6. The hold-down assembly of claim 5, wherein the central bore of the locking collar includes a double-D-shaped cross-section corresponding to the shaft such that the locking collar can freely slide on the shaft but not rotate with respect to the shaft.

7. The hold-down assembly of claim 5, wherein the non-rotatable ratchet plate of the actuator knob includes a plate bore with a double-D-shaped cross-section corresponding to the shaft such that the ratchet plate can freely slide on the shaft but is non-rotatable with respect to the shaft.

8. The hold-down assembly of claim 7, wherein the knob body includes an inwardly-directed rolled edge for operatively engaging the ratchet plate to keep the ratchet plate within the knob body as the actuator knob moves along the shaft.

9. The hold-down assembly of claim 1, wherein the at least one ball bearing produces an audible snap noise as the at least one ball bearing moves into a new detent hole in the ratchet plate.

10. The hold-down assembly of claim 1, wherein the shaft includes a free end opposite the hinge block, and the free end is flattened or deformed after the locking collar and actuator knob are placed on the shaft, thereby preventing removal of the locking collar and actuator knob from the hold-down assembly.

11. The hold-down assembly of claim 1, wherein the actuator knob comprises two ball bearings and two corresponding compression springs disposed within the knob body, the two ball bearings engaging different detent holes in the ratchet plate.

12. The hold-down assembly of claim 1, wherein the at least one ball bearing is formed from steel and the ratchet plate is formed from a thermoplastic material, thereby limiting frictional resistance to relative rotation of the at least one ball bearing with respect to the ratchet plate.

13. The hold-down assembly of claim 12, wherein the ratchet plate is formed from an acetal material.

\* \* \* \* \*